United States Patent
Nammi et al.

(10) Patent No.: US 10,608,669 B2
(45) Date of Patent: Mar. 31, 2020

(54) PERFORMANCE OF DATA CHANNEL USING POLAR CODES FOR A WIRELESS COMMUNICATION SYSTEM

(71) Applicant: AT&T INTELLECTUAL PROPERTY I, L.P., Atlanta, GA (US)

(72) Inventors: SaiRamesh Nammi, Austin, TX (US); Arunabha Ghosh, Austin, TX (US)

(73) Assignee: AT&T INTELLECTUAL PROPERTY I, L.P., Atlanta, GA (US)

( * ) Notice: Subject to any disclaimer, the term of this patent is extended or adjusted under 35 U.S.C. 154(b) by 90 days.

(21) Appl. No.: 15/932,232

(22) Filed: Feb. 16, 2018

(65) Prior Publication Data

US 2019/0260393 A1    Aug. 22, 2019

(51) Int. Cl.
| | |
|---|---|
| *H03M 13/00* | (2006.01) |
| *H03M 13/15* | (2006.01) |
| *H04L 1/00* | (2006.01) |

(52) U.S. Cl.
CPC ......... *H03M 13/15* (2013.01); *H04L 1/0041* (2013.01); *H04L 1/0045* (2013.01);
(Continued)

(58) Field of Classification Search
CPC .... H03M 13/15; H04L 1/0057; H04L 1/0067; H04L 1/0046; H04L 1/0072
(Continued)

(56) References Cited

U.S. PATENT DOCUMENTS

| 8,290,073 B2 | 10/2012 | Kasher |
|---|---|---|
| 9,178,532 B2 | 11/2015 | Li et al. |

(Continued)

FOREIGN PATENT DOCUMENTS

| CN | 103281166 | 9/2013 |
|---|---|---|
| KR | 101496182 | 3/2013 |

(Continued)

OTHER PUBLICATIONS

Dizdar, et al., "A high-throughput energy-efficient implementation of successive cancellation decoder for polar codes using combinational logic," IEEE Transactions on circuits and Systems I: Regular Papers 633, pp. 436-447 (2016).

(Continued)

*Primary Examiner* — Albert Decady
*Assistant Examiner* — Osman M Alshack
(74) *Attorney, Agent, or Firm* — Amin, Turocy & Watson, LLP

(57) ABSTRACT

Various embodiments provide for encoding and decoding data channel information with polar codes where the frozen bits of the information block can be set to a scrambling identifier based on the device ID, cell ID, or some other unique identifier instead of being set to null. The frozen bits can be identified based on the type of polar code being used, and while the non-frozen bits can be coded with the data link data, the frozen bits can be coded with the scrambling identifier. In an example where there are more frozen bits than bits in the scrambling identifier, the most reliable of the frozen bits can be coded with the scrambling identifier. In another example, the frozen bits can be set to the CRC bits, which can then be masked by the scrambling identifier.

20 Claims, 10 Drawing Sheets

(52) U.S. Cl.
CPC .......... *H04L 1/0046* (2013.01); *H04L 1/0057* (2013.01); *H04L 1/0061* (2013.01); *H04L 1/0067* (2013.01); *H04L 1/0072* (2013.01)

(58) Field of Classification Search
USPC .................................................. 714/752, 758
See application file for complete search history.

(56) References Cited

U.S. PATENT DOCUMENTS

| | | | |
|---|---|---|---|
| 9,239,778 B2 | 1/2016 | Lee et al. | |
| 9,467,164 B2 | 10/2016 | Ionita et al. | |
| 9,503,126 B2 | 11/2016 | Vardy et al. | |
| 9,628,114 B2 | 4/2017 | Huang et al. | |
| 9,667,381 B2 | 5/2017 | Jeong et al. | |
| 10,341,044 B2 * | 7/2019 | Zhang | H03M 13/13 |
| 2014/0105155 A1 * | 4/2014 | Kim | H04L 1/1861 370/329 |
| 2016/0013810 A1 | 1/2016 | Gross et al. | |
| 2016/0164629 A1 | 6/2016 | Ahn et al. | |
| 2017/0079065 A1 * | 3/2017 | Lyu | H04W 72/04 |
| 2017/0155405 A1 | 6/2017 | Ge et al. | |
| 2017/0214416 A1 | 7/2017 | Ge et al. | |
| 2017/0222757 A1 | 8/2017 | Huang et al. | |
| 2017/0257186 A1 | 9/2017 | Ge et al. | |
| 2017/0353193 A1 | 12/2017 | Jang et al. | |
| 2017/0366199 A1 * | 12/2017 | Ge | H03M 13/09 |
| 2017/0366204 A1 | 12/2017 | Shi et al. | |
| 2018/0007683 A1 * | 1/2018 | You | H04L 1/0067 |
| 2018/0048418 A1 | 2/2018 | Ge et al. | |
| 2018/0083758 A1 * | 3/2018 | Islam | H04L 5/0083 |
| 2018/0123765 A1 * | 5/2018 | Cao | H04L 1/1861 |
| 2018/0124753 A1 * | 5/2018 | Sun | H04W 72/042 |
| 2018/0192403 A1 * | 7/2018 | Shelby | H04L 1/0041 |
| 2019/0097693 A1 * | 3/2019 | Park | H04L 5/0053 |

FOREIGN PATENT DOCUMENTS

| | | |
|---|---|---|
| WO | 2014173133 | 10/2014 |
| WO | 2017082626 | 5/2017 |
| WO | 2017106246 | 6/2017 |
| WO | 2017128700 | 8/2017 |
| WO | 2017157027 | 9/2017 |
| WO | 2017157028 | 9/2017 |
| WO | 2017193677 | 11/2017 |
| WO | 2018021925 | 2/2018 |
| WO | 2018021926 | 2/2018 |
| WO | 2018029628 | 2/2018 |
| WO | 2018031712 | 2/2018 |
| WO | 2018033206 | 2/2018 |

OTHER PUBLICATIONS

Eslami, et al., "A practical approach to polar codes," Informtation Theory Proceedings (ISIT), 2011 IEEE International Symposium, IEEE, pp. 1-5 (2011).

Mohammadi, et al., "Joint binary field transform and polar coding," Communications (ICC), 2015 IEEE International Conference, IEEE, pp. 1-7 (2015).

Niu, et al., "CRC-aided decoding of polar codes," IEEE Communications Letters 1610, pp. 1668-1671 (2012).

Xiong, et al., "Symbol-decision successive cancellation list decoder for polar codes," IEEE Transactions on Signal Processing 64.3, pp. 675-687 (2016).

Giard, et al., "High-speed decoders for polar codes," Springer, pp. 1-131 (2017).

International Search Report and Written Opinion received for PCT Application Serial No. PCT/US2019/017135 dated Apr. 23, 2019, 16 pages.

AT&T, "Polar Code Design for DCI", 3GPP TSG RAN WG1 Meeting #88, R1-1702277, Feb. 13-17, 2017, pp. 1-3.

Coherent Logix Inc., "Early Block Discrimination on DCI Blind Detection", 3GPP TSG RAN1-NR#2, R1-1711573, Jun. 27-30, 2017, 7 pages.

Huawei, "Performance evaluation of channel coding schemes for control channel", 3GPP TSG RAN WG1 Meeting #87, R1-1611257, Nov. 14-18, 2016, 11 pages.

LG Electronics, "Scrambling on information bits for distributed CRC", 3GPP TSG RAN WG1 Meeting NR#3, R1-1715896, Sep. 18-21, 2017, 3 pages.

Tsofun Algorithm, "Simplified UE-Specific Scrambling for DL Control", 3GPP TSG RAN WG1 Meeting 90bis, R1-1718504, Oct. 9-13, 2017, 8 pages.

LG Electronics, "Data transmission during random access procedure in MTC", 3GPP TSG RAN WG1 Meeting #90, R1-1713099, Aug. 21-25, 2017, 6 pages.

* cited by examiner

PERFORMANCE OF DATA CHANNEL USING POLAR CODES FOR A WIRELESS COMMUNICATION SYSTEM

TECHNICAL FIELD

The disclosed subject matter relates to encoding and decoding data channel information blocks using polar codes to enable improvement of wireless system performance over conventional wireless system technologies, e.g., for fifth generation (5G) technologies or other next generation networks.

BACKGROUND

To meet the huge demand for data centric applications, third generation partnership project (3GPP) systems and systems that employ one or more aspects of the specifications of fourth generation (4G) standards for wireless communications will be extended to fifth generation (5G) standards for wireless communications. Unique challenges exist to provide levels of service associated with forthcoming 5G and/or other next generation standards for wireless networks.

BRIEF DESCRIPTION OF THE DRAWINGS

Non-limiting and non-exhaustive embodiments of the subject disclosure are described with reference to the following tigures, wherein like reference numerals refer to like parts throughout the various views unless otherwise specified.

DETAILED DESCRIPTION

Figure 1:
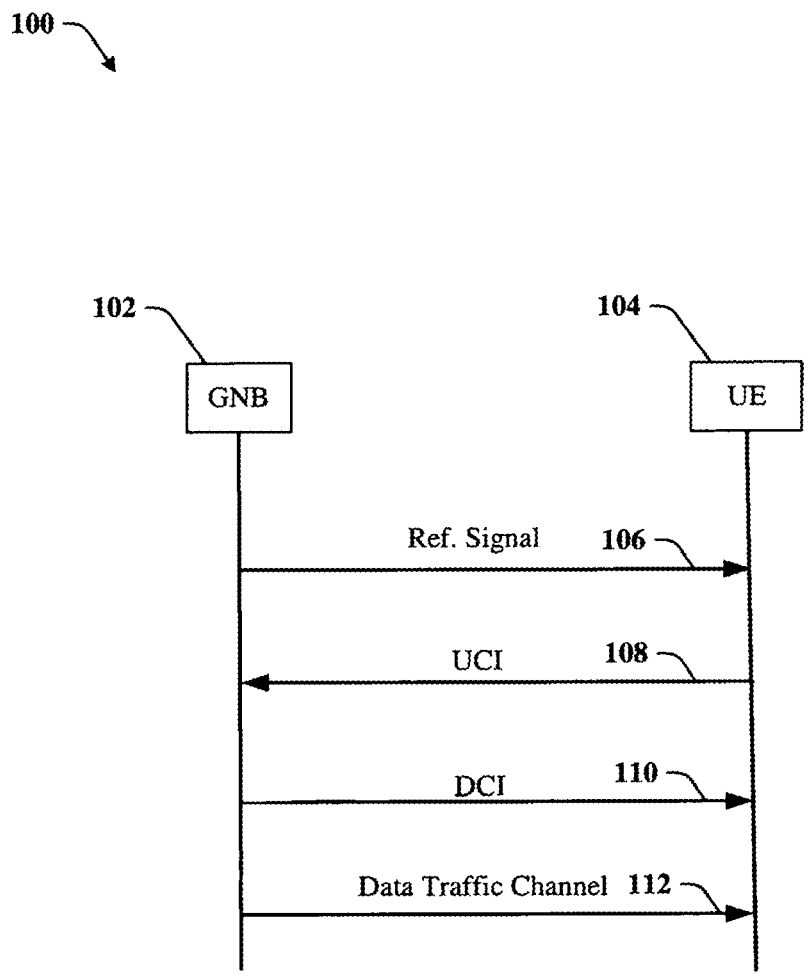
FIG. 1 illustrates an example schematic diagram of a message sequence chart for uplink and downlink data channel transmissions in accordance with various aspects and embodiments of the subject disclosure.

One or more embodiments are now described with reference to the drawings, wherein like reference numerals are used to refer to like elements throughout. In the following description, for purposes of explanation, numerous specific details are set forth in order to provide a thorough understanding of the various embodiments. It is evident, however, that the various embodiments can be practiced without these specific details (and without applying to any particular networked environment or standard).

In an embodiment, a transmitter device can comprise a processor and a memory that stores executable instructions that, when executed by the processor, facilitate performance of operations, including transmitting a scrambling identification number to a receiving device via radio resource control channel signaling. The operations can also include based on a type of a polar forward error correction code, determining locations of frozen bits in a data channel information block. The operations can also include coding non-frozen bits of the data channel information block with data channel data to facilitate a data transmission. The operations can also include coding the frozen bits of the data channel information block with the scrambling identification number, resulting in bits coded with the scrambling identification number.

In another embodiment, a method can include transmitting, by a device comprising a processor, a scrambling identification number to a receiver via radio resource control channel signaling. The method can also include determining, by the device, respective reliabilities of bit locations in a data channel information block, the determining the respective reliabilities being based on a type of a polar forward error correction code. The method can also include coding, with data traffic data and by the device, a first group of the bit locations determined to have first reliabilities of the respective reliabilities above a first reliability threshold. The method can also include coding, with the scrambling identification number and by the device, a second group of bit locations determined to have second reliabilities of the respective reliabilities below a second reliability value.

In another embodiment, a machine-readable storage medium, comprising executable instructions that, when executed by a processor of a device, facilitate performance of operations. The operations can include receiving a scrambling identification number from a transmitter device via radio resource control channel signaling. The operations can also include decoding a data channel information block with a polar forward error correction code resulting in a decoded data channel information block. The operations can also include based on a type of the polar forward error correction code, determining locations of a group of frozen bits in the decoded data channel information block. The operations can also include unmasking the group of frozen bits with the scrambling identification number, wherein the unmasking results in cyclic redundancy check bits.

In various embodiments, polar forward error correction codes can be used to improve the performance of data channels by protecting the integrity of the information bits from interference, multipath fading, additive white Gaussian noise (AWGM) etc. In an embodiment polar forward error correction codes can be used in 5G wireless communication systems in order to protect data link channels, uplink and downlink. Polar codes, achieve the symmetric capacity of arbitrary binary-input discrete memory-less channels under a low complexity successive cancellation decoding strategy. When using polar codes, the reliability of certain bit locations in an information block can vary, and so, information that is to be protected can be coded into the bit locations that are above a predetermined reliability. Other bit locations, below the predetermined reliability threshold, are called "frozen bits" and are generally set as null bits and do not carry the payload data.

In legacy systems, cyclic redundancy check bits are appended to information blocks in order to detect changes to raw data. The cyclic redundancy check (CRC) bits can be masked with a scrambling identifier of the user equipment or base station device to which the transmission is directed. In this way, devices which are not being addressed will be unable to decode the transmissions. In an embodiment, the scrambling identifier can be a radio network temporary identifier (RNTI) (including C-RNTI, S-RNTI, and etc) or can be generated from a UE specific pseudonoise sequence generation as Pseudo-random sequences are defined by a length-31 Gold sequence.

In an embodiment therefore, a system for encoding and decoding data channel information with polar codes is provided where the frozen bits of the information block can be set to the device identification number instead of being set to null. The frozen bits can be identified based on the type of polar code being used, and while the non-frozen bits can be coded with the data channel information, the frozen bits can be coded with the scrambling identifier. In an embodiment where there are more frozen bits than bits in the scrambling identifier, the most reliable of the frozen bits can be coded with the scrambling identifier. In another embodiment, the frozen bits can be set to the CRC bits, which can then be masked by the scrambling identifier.

Turning now to FIG. 1, illustrated is an example schematic diagram of a message sequence chart 100 for downlink data link information in accordance with various aspects and embodiments of the subject disclosure. In an embodiment, a gNodeB 102 can send a reference signal 106 to a UE 104. The reference signal can be beamformed in some embodiments, or non beamformed in other embodiments.

Based on the reference signal 106, the UE 104 can measure the channel response, and determine channel state information (CSI) to give as feedback to the gNodeB 102. The channel state information can include a channel quality indicator, precoding matrix index, or advanced PMI. This channel state information can refer to the known channel properties of the communication link between the gNodeB 102 and the UE 104. The channel properties can reflect how the signal propagates from the transmitter to the receiver and represents the combined effect of, for example, scattering, fading, and power decay with distance.

Once the channel state information is assembled, the UE 104 can transmit the UCI 108 to the gNodeB 102. Based, on the UCI 108, the gNodeB 102 can then send downlink control information (DCI) 110 to the UE 104 which enables the UE to send the data over the data traffic channel 112.

In an embodiment, the downlink data traffic channel 112 can be encoded using polar codes. Polar codes can be linear block error correcting codes that are constructed based on a multiple recursive concatenation of a short kernel code which transforms the physical channel into virtual outer channels. When the number of recursions becomes large, the virtual channels or bit locations tend to either have high reliability or low reliability (in other words, they polarize), and the data bits are allocated to the most reliable bit locations. Therefore, in an embodiment, the data link information contained in the downlink data traffic channel 112 can be allocated to the reliable bit locations, while the scrambling identifier can be allocated to the less reliable bit locations.

In an embodiment, the bit locations that have a reliability below a predetermined reliability level can be called frozen bits, while the bit locations that are above the predetermined reliability level can be call non-frozen bits, and be allocated to the payload data (e.g., channel state information). In an embodiment, the scrambling identifier can be 16 bits, and the predetermined reliability level can be set such that there are at least 16 bit locations below the reliability level such that there are enough frozen bit locations to accommodate the scrambling identifier. In embodiments where there are more than 16 frozen bits, or more frozen bits than scrambling identifier bits, the scrambling identifier can be allocated to the most reliable of the frozen bits. The remainder of the frozen bits can then be set to a fixed value (e.g., "0"). In at least one embodiment, the frozen bits can incorporate the CRC bits, which can then be masked with the scrambling identifier.

In an embodiment, the scrambling identifier may comprise or include the radio network temporary identifier (or e.g., C-RNTI, S-RNTI, etc.) or it can be generated from a UE specific pseudonoise sequence generation. Pseudo-random sequences can be defined by a length-31 Gold sequence. The output sequence c(n) of length $M_{PN}$, where n=0, 1, . . . , $M_{PN}$−1, is defined by:

$$c(n)=(x_1(n+N_C)+x_2(n+N_C)) \bmod 2$$

$$x_1(n+31)=(x_1(n+3)+x_1(n)) \bmod 2$$

$$x_2(n+31)=(x_2(n+3)+x_2(n+2)+x_2(n+1)+x_2(n)) \bmod 2 \quad \text{Equation 1}$$

where $N_C$=1600 and the first m-sequence shall be initialized with $x_1(0)$=1, $x_1(n)$=0, n=1,2, . . . , 30. The initialization of the second m-sequence is denoted by $c_{init}=\Sigma_{i=0}^{30} x_2(i) \cdot 2^i$ with the value depending on the application of the sequence.

$$C_{init} = \left\{ n_{RNTI} \cdot 2^{14} + A + N_{ID}^{cell} \right. \quad \text{Equation 2}$$

Where the RNTI is the length of the RNTI, A is any additional parameter and Ncell$_{13}$ ID is the unique ID of the cell where the transmission is taking place to the UE 104. Note that these parameters are communicated to the UE via higher layer signaling a priori (e.g., radio resource control channel signaling). In another embodiment, some of these parameters are communicated via physical layer signaling such as control channel etc.

It is to be appreciated that while reference is made in FIG. 1 to using polar codes for a downlink data channel, the same principles can be applied to an uplink data channel from the UE 104 to the GNB 102 in other embodiments. For an uplink data channel however, it is to be appreciated that the GNB 102 will still communication the scrambling identifier to the UE 104.

It is also to be appreciated that in an embodiment, the type of data channel being encoded with polar forward error correction codes can be a ultra reliable low latency type data communication (URLLC) and/or massive Machine Type of Communication systems (mMTC). For URLLC applications, the reliability is most important. Hence the same LDPC code which is designed for eMBB applications (for providing the peak data rate) is not suitable for these applications. Hence, an efficient channel coding scheme is desirable for data channels in URLLC applications.

Figure 2:
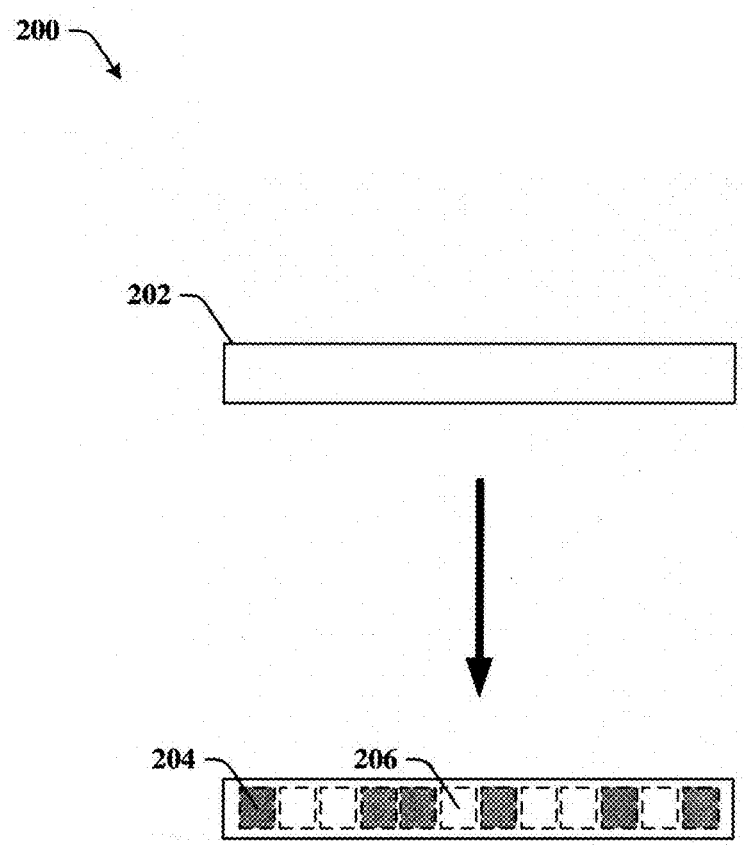
FIG. 2 illustrates an example block diagram of a data channel information block with frozen and non-frozen bits in accordance with various aspects and embodiments of the subject disclosure.

Turning now to FIG. 2, illustrated is an example block diagram 200 of a data channel information block with frozen and non-frozen bits in accordance with various aspects and embodiments of the subject disclosure. In an embodiment, a transmitter can determine the reliability of various bit locations in an information block 202 of data channel information and identify which bits are non-frozen bits e.g., bit 206, and which bits are frozen, e.g., bit 204.

The system can identify which bits are frozen based on determining a reliability of each of the bit locations. The system can estimate the reliability based on signal to noise ratio at each of the bit locations or can perform fixed weight computations at each of the bit locations. In other embodiments, the system can use Bhattacharyya bounding which measures the similarity of two discrete or continuous probability distributions.

The system can rank the reliability (or the probability of a decoding error upon transmission of the information block 202) at each bit location, and bit locations with reliabilities above a predetermined threshold (e.g., probability of error below a specified level) will be non-frozen bits, chosen to transport the payload data of channel state information. Bit locations with reliabilities below the predetermined threshold (e.g., probability of error above the specified level) will be frozen bits, and will be coded with the scrambling identifier, or set to CRC bits which will then be masked with the scrambling identifier.

In an embodiment, the bit locations can be based on the type of polar code selected to encode/decode the data channels. Different polar codes, based on the encoding/decoding process, may have different locations that have different reliabilities. Similarly, for a given polar code, information blocks of different lengths may have different frozen and non-frozen bit locations.

Figure 3:
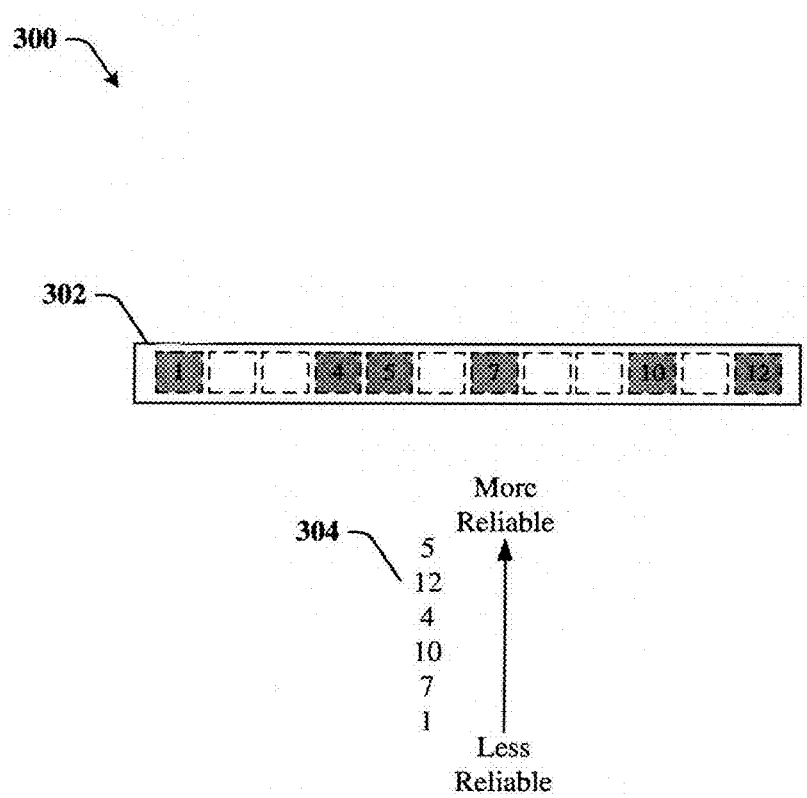
FIG. 3 illustrates an example block diagram of a data channel information block with frozen bits ranked in reliability in accordance with various aspects and embodiments of the subject disclosure.

Turning now to FIG. 3, illustrated is an example block diagram 300 of a data channel information block with frozen bits ranked in reliability in accordance with various aspects and embodiments of the subject disclosure.

The system can rank the reliability (or the probability of a decoding error upon transmission of the information block 302) at each bit location, and bit locations with reliabilities above a predetermined threshold (e.g., probability of error below a specified level) will be non-frozen bits, chosen to transport the payload data of a data link transmission. Bit locations with reliabilities below the predetermined threshold (e.g., probability of error above the specified level) will be frozen bits, and will be coded with the scrambling identifier, or set to CRC bits which will then be masked with the scrambling identifier.

In an embodiment, the system can determine that in information block 302 with 12 bit locations, there are 6 frozen bits, at bit locations 1, 4, 5, 7, 10, and 12. It is to be appreciated that in certain embodiments, the size of the information block 302 can be larger or smaller, with different numbers and proportions of frozen bits to non-frozen bits. In general, the size of the information block is large enough that the number of frozen bits is at least equal to the number of bits in the scrambling identifier (e.g., 16 bits in an embodiment).

In an embodiment, the system can rank the reliability of the frozen bit locations at 304. In an embodiment, the bit locations can be ranked, in order of highest reliability to lowest reliability: 4, 5, 12, 10, 7, 1. In an embodiment, to improve throughput and reduce the probability of the scrambling identifier being corrupted, if the scrambling identifier is 3 bits long, bit locations 4, 5, and 12 can be selected to encode the scrambling identifier. In this way, the most reliable of the bit locations are used to code the scrambling identifier.

In an embodiment, the scrambling identifier can be encoded based on the order of the frozen bit locations within the information block. For instance, if the scrambling identifier is 3 bits long, the 3 most reliable bit locations in the information block 302 can be selected in which to code the scrambling identifier, e.g., bit locations 5, 12, and 4. In this embodiment, the scrambling identifier of 1-2-3 can be coded into bit locations 4, 5, and 12 respectively.

In other embodiments, the scrambling identifier can be encoded based on the reliability ranking. In this embodiment, the scrambling identifier of 1-2-3 can be coded into bit locations 5, 12, and 4 respectively. The decoder on the receiver side, can rank the reliability of the bit locations in order to determine the correct order of the scrambling identifier encoded in the frozen bit locations in order to decode the encoded code word.

Figure 4:
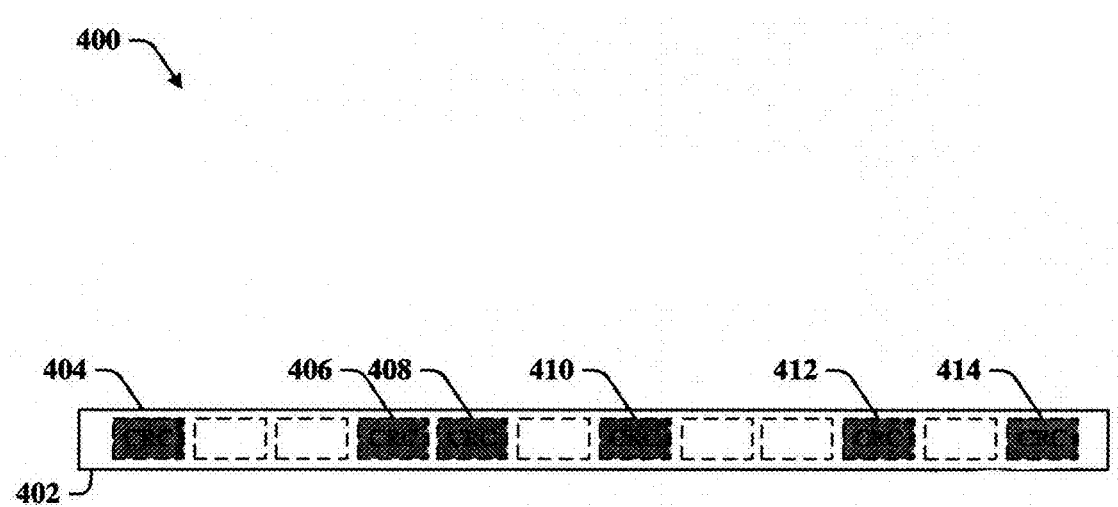
FIG. 4 illustrates an example block diagram of frozen bits coded with cyclic redundancy check bits in accordance with various aspects and embodiments of the subject disclosure.

Turning now to FIG. 4, illustrated is an example block diagram 400 of frozen bits coded with cyclic redundancy check bits in accordance with various aspects and embodiments of the subject disclosure.

In an embodiment, the frozen bit locations of information block 402 can be mapped with CRC bits at 404, 406, 408, 410, 412, and 414. The cyclic redundancy check (CRC) bits can be masked with the scrambling identifier of the user equipment or base station device to which the transmission is directed. In this way, devices which are not being addressed will be unable to decode the transmissions.

In an embodiment, the CRC bits can be masked with the scrambling identifier, and then mapped to the frozen bit locations. In some embodiments, the CRC bits can be masked by performing a logical exclusive-or between the CRC bits and the scrambling identifier.

Figure 5:
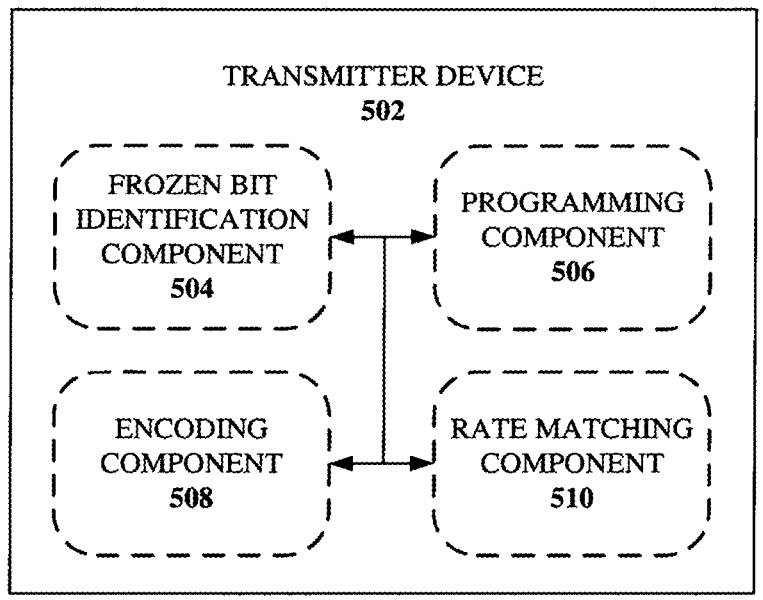
FIG. 5 illustrates an example block diagram of a transmitter device that facilitates encoding data channel data with a polar code in accordance with various aspects and embodiments of the subject disclosure.

Turning now to FIG. 5, illustrated is an example block diagram 500 of a transmitter device 502 that facilitates encoding data channel data with a polar code in accordance with various aspects and embodiments of the subject disclosure.

The transmitter device 502 can include a frozen bit identification component 504 that is configured to determine locations of frozen bits in a data channel information block, wherein the locations of the frozen bits are determined based on a type of forward error correction code. The transmitter device 502 can also include a programming component 506 that is configured to code non-frozen bits of the data channel information block with data to facilitate a data transmission and code the frozen bits of the data channel information block with an identification number associated with a mobile device, resulting in bits coded with the identification number.

In embodiment, the transmitter device 502 can also include an encoding component that encodes the data channel information block with the forward error correction code into a codeword equal in length to a sum of the frozen bits and the non frozen bits. The transmitter device 502 can also include a rate matching component 510 that can split the codeword into partial codewords to facilitate rate matching of a transmission block.

The frozen bit identification component 504 can identify which bits are frozen based on determining a reliability of each of the bit locations. The frozen bit identification component 504 can estimate the reliability based on signal to noise ratio at each of the bit locations or can perform fixed weight computations at each of the bit locations. In other embodiments, the frozen bit identification component 504 can use Bhattacharyya bounding which measures the similarity of two discrete or continuous probability distributions.

The frozen bit identification component 504 can rank the reliability (or the probability of a decoding error upon transmission of the information block) at each bit location, and bit locations with reliabilities above a predetermined threshold (e.g., probability of error below a specified level) will be non-frozen bits, chosen to transport the payload data of data information.

In an embodiment, the bit locations can be based on the type of polar code selected to encode/decode the data channels. Different polar codes, based on the encoding/decoding process, may have different locations that have different reliabilities. Similarly, for a given polar code, information blocks of different lengths may have different frozen and non-frozen bit locations.

The programming component 506 can program frozen bit locations with the scrambling identifier based on the order of the frozen bit locations within the information block. For instance, if the scrambling identifier is 3 bits long, the 3 most reliable bit locations m the information block can be selected in which to code the device ID, e.g., bit locations 5, 12, and 4 (from FIG. 3). In this embodiment, the device ID of 1-2-3 can be coded into bit locations 4, 5, and 12 respectively.

In other embodiments, the scrambling identifier can be programmed by the programming component 506 based on the reliability ranking. In this embodiment, the scrambling identifier of 1-2-3 can be coded into bit locations 5, 12, and 4 respectively. The decoder on the receiver side, can rank the reliability of the bit locations in order to determine the correct order of the scrambling identifier encoded in the frozen bit locations in order to decode the encoded code word.

Figure 6:
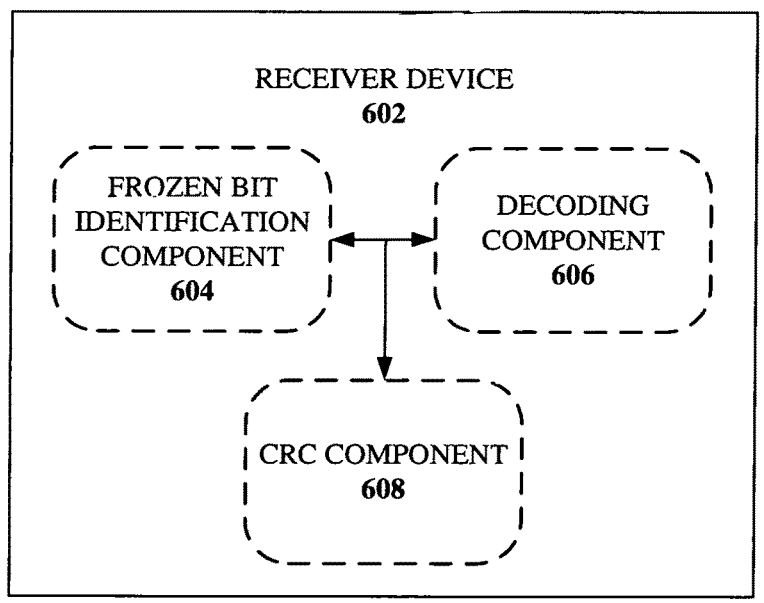
FIG. 6 illustrates an example block diagram of a receiver device that decodes data channel data with a polar code in accordance with various aspects and embodiments of the subject disclosure.

Turning now to FIG. 6, illustrated is an example block diagram 600 of a receiver device 602 that decodes data channel data with a polar code in accordance with various aspects and embodiments of the subject disclosure.

In an embodiment, the receiver device 602 can include a frozen bit identification component 604 that can determine locations of frozen bits in a data channel information block, wherein the locations of the frozen bits are determined based on a type of polar code. The receiver device 602 can also include a decoding component 606 that is configured to decode the codeword that comprises the encoded data channel information block using the scrambling identifier in the place of identified frozen bits. If the frozen bits also include the CRC bits, masked with the scrambling identifier a CRC component 608 can perform a CRC check and facilitate unmasking the scrambling identifier. The Receiver device can also send back to the transmitter and/or mobile network a hybrid ARQ acknowledgement (HARQ-ACK) in response to the CRC check passing.

Figure 7:
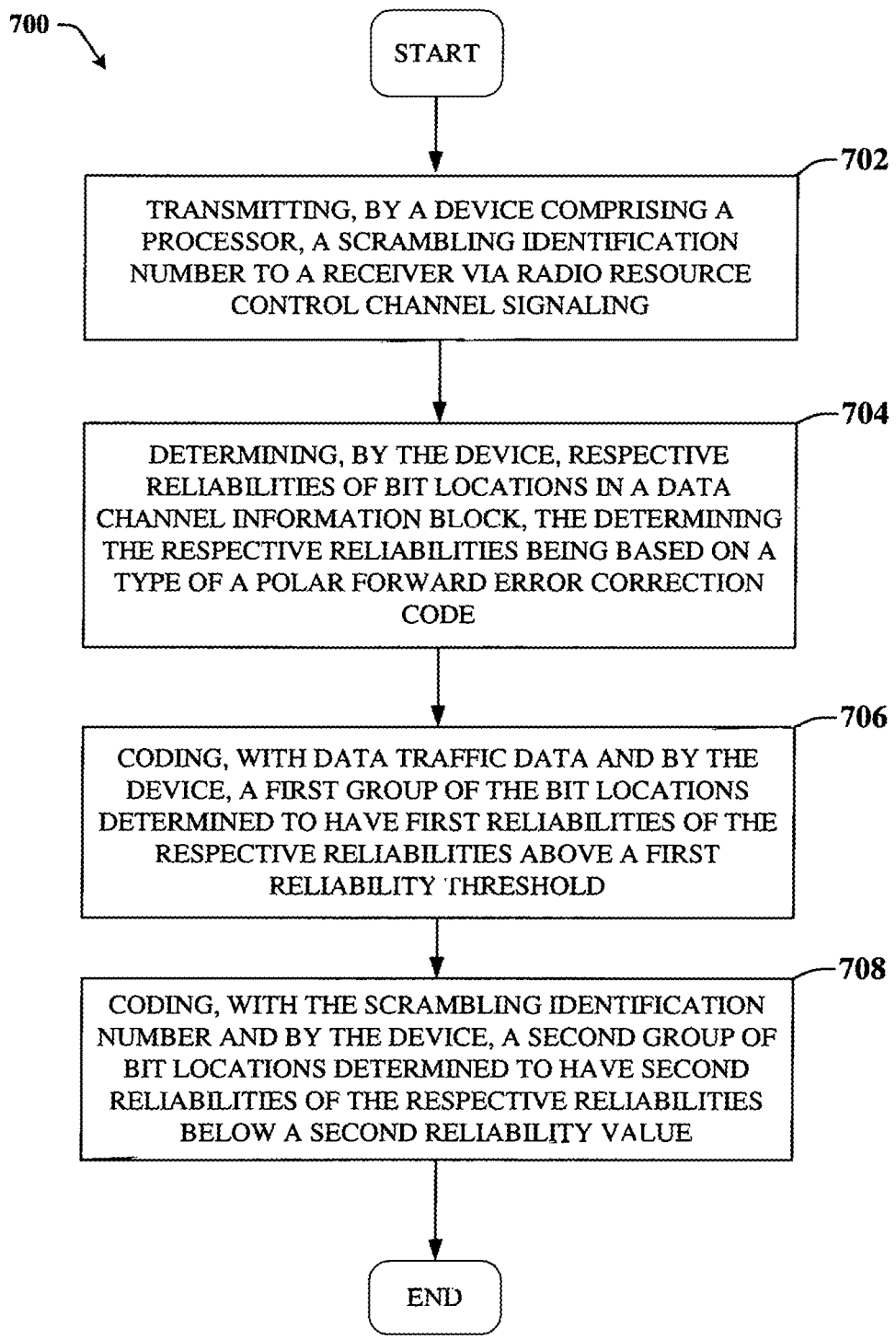
FIG. 7 illustrates an example method for encoding data channel data with polar codes in accordance with various aspects and embodiments of the subject disclosure.
Figure 8:
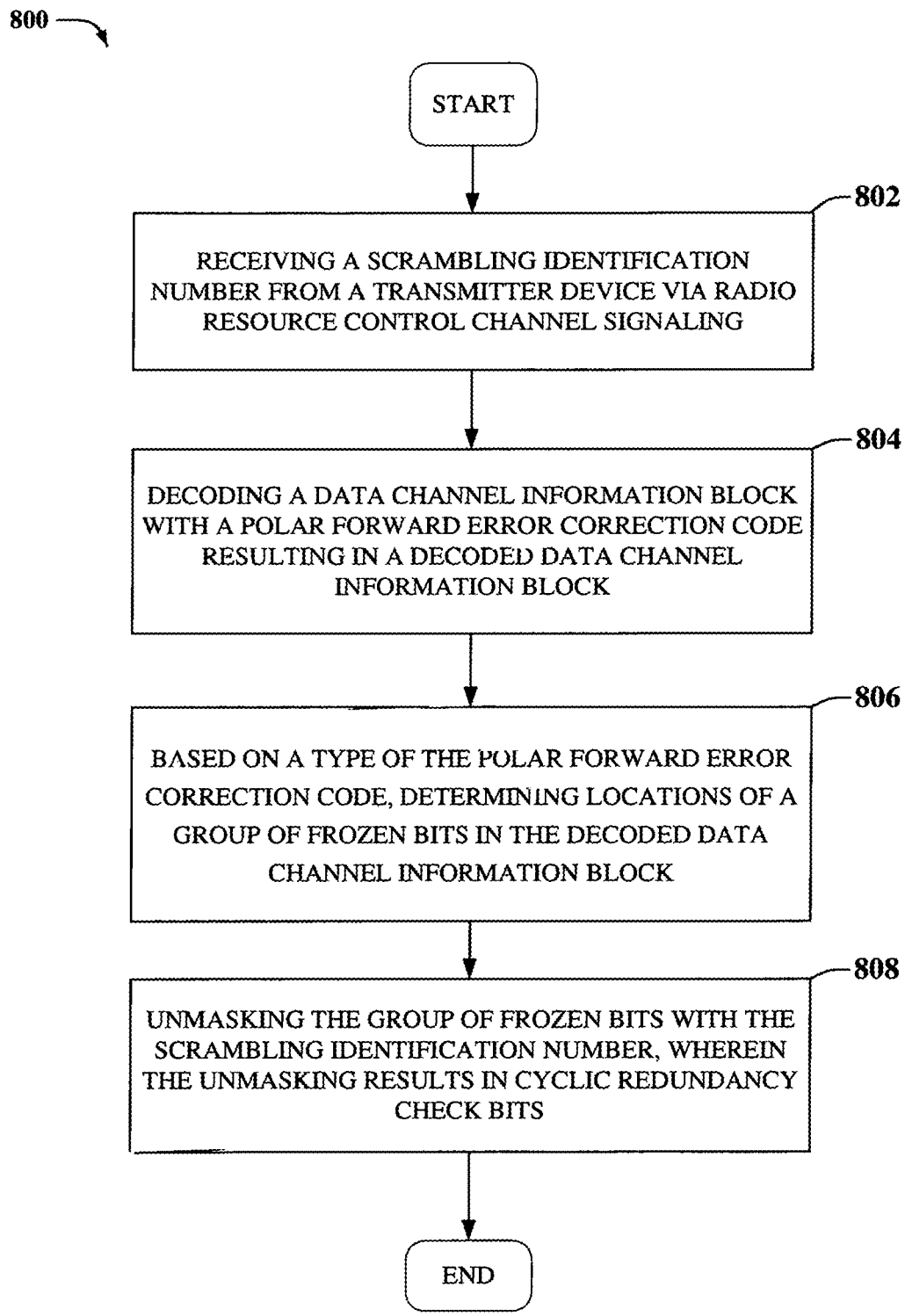
FIG. 8 illustrates an example method for decoding data channel data with polar codes in accordance with various aspects and embodiments of the subject disclosure.

FIGS. 7-8 illustrates a process in connection with the aforementioned systems. The process in FIGS. 7-8 can be implemented for example by the systems in FIGS. 1-6 respectively. While for purposes of simplicity of explanation, the methods are shown and described as a series of blocks, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described hereinafter.

Turning now to FIG. 7, illustrated is an example method 700 for encoding data channel data with polar codes in accordance with various aspects and embodiments of the subject disclosure.

Method 700 can start at 702 where the method includes transmitting, by a device comprising a processor, a scrambling identification number to a receiver via radio resource control channel signaling.

At 704, the method includes determining, by the device, respective reliabilities of bit locations in a data channel information block, the determining the respective reliabilities being based on a type of a polar forward error correction code.

At 706, the method includes coding, with data traffic data and by the device, a first group of the bit locations determined to have first reliabilities of the respective reliabilities above a first reliability threshold.

At 708, the method includes coding, with the scrambling identification number and by the device, a second group of bit locations determined to have second reliabilities of the respective reliabilities below a second reliability value.

Turning now to FIG. 8, illustrated is an example method 800 for decoding data channel data with polar codes in accordance with various aspects and embodiments of the subject disclosure.

Method 800 can start at 802 where the method includes receiving a scrambling identification number from a transmitter device via radio resource control channel signaling.

At 804, the method includes decoding a data channel information block with a polar forward error correction code resulting in a decoded data channel information block.

At 806, the method includes based on a type of the polar forward error correction code, determining locations of a group of frozen bits in the decoded data channel information block.

At 808, the method includes unmasking the group of frozen bits with the scrambling identification number, wherein the unmasking results in cyclic redundancy check bits.

Figure 9:
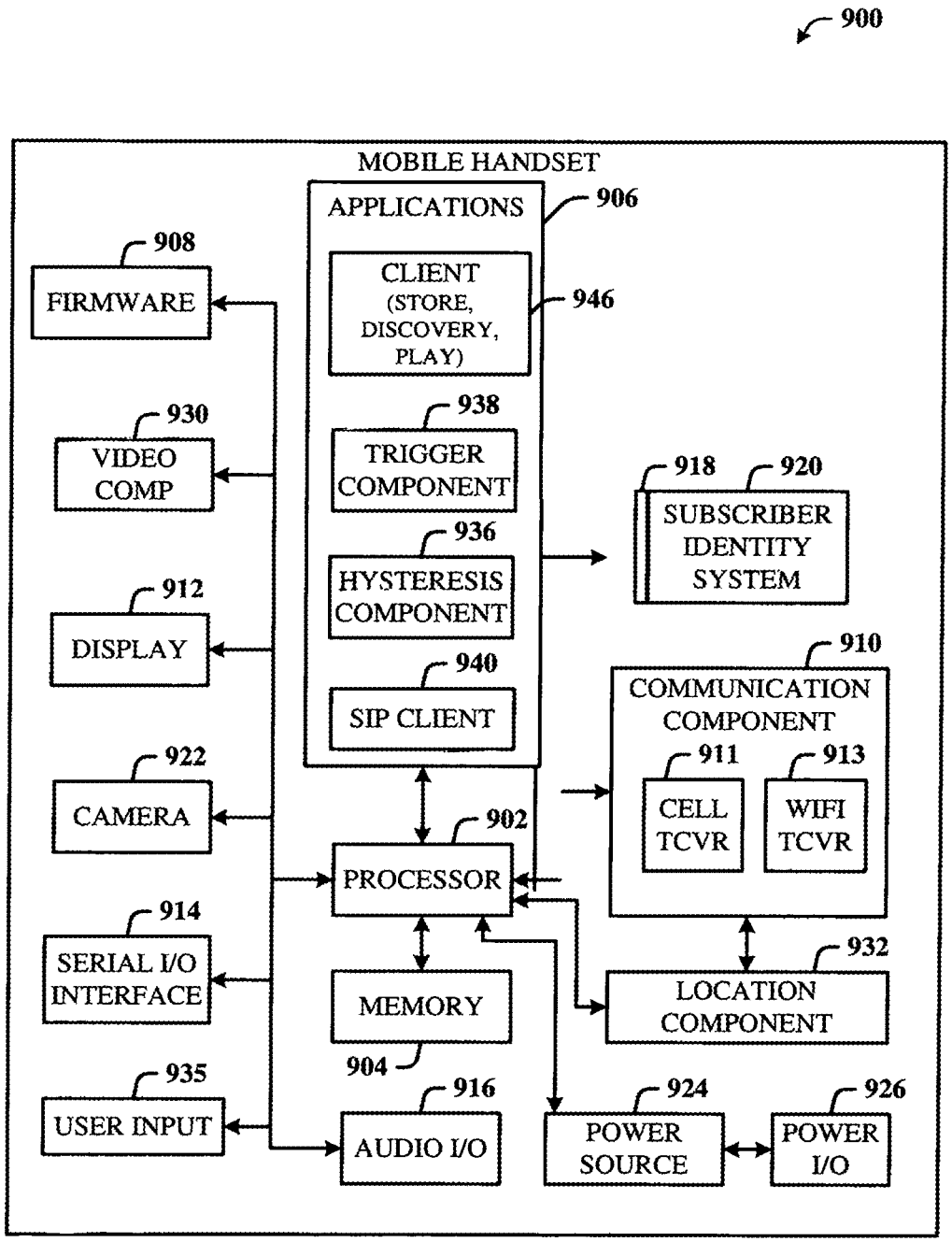
FIG. 9 illustrates an example block diagram of an example user equipment that can be a mobile handset operable in accordance with various aspects and embodiments of the subject disclosure.

Referring now to FIG. 9, illustrated is a schematic block diagram of an example end-user device such as a user equipment (e.g., transmitter device 502 or receiver device 602) that can be a mobile device 900 capable of connecting to a network in accordance with some embodiments described herein. Although a mobile handset 900 is illustrated herein, it will be understood that other devices can be a mobile device, and that the mobile handset 900 is merely illustrated to provide context for the embodiments of the various embodiments described herein. The following discussion is intended to provide a brief, general description of an example of a suitable environment 900 in which the various embodiments can be implemented. While the description includes a general context of computer-executable instructions embodied on a machine-readable storage medium, those skilled in the art will recognize that the innovation also can, be implemented in combination with other program modules and/or as a combination of hardware and software.

Generally, applications (e.g., program modules) can include routines, programs, components, data structures, etc., that perform particular tasks or implement particular abstract data types. Moreover, those skilled in the art will appreciate that the methods described herein can be practiced with other system configurations, including single-processor or multiprocessor systems, minicomputers, mainframe computers, as well as personal computers, hand-held computing devices, microprocessor-based or programmable consumer electronics, and the like, each of which can be operatively coupled to one or more associated devices.

A computing device can typically include a variety of machine-readable media. Machine-readable media can be any available media that can be accessed by the computer and includes both volatile and non-volatile media, removable and non-removable media. By way of example and not limitation, computer-readable media can comprise computer storage media and communication media. Computer storage media can include volatile and/or non-volatile media, removable and/or non-removable media implemented in any method or technology for storage of information, such as computer-readable instructions, data structures, program modules or other data. Computer storage media can include, but is not limited to, RAM, ROM, EEPROM, flash memory or other memory technology, CD ROM, digital video disk (DVD) or other optical disk storage, magnetic cassettes, magnetic tape, magnetic disk storage or other magnetic storage devices, or any other medium which can be used to store the desired information and which can be accessed by the computer.

Communication media typically embodies computer-readable instructions, data structures, program modules or other data in a modulated data signal such as a carrier wave or other transport mechanism, and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of the any of the above should also be included within the scope of computer-readable media.

The handset 900 includes a processor 902 for controlling and processing all onboard operations and functions. A memory 904 interfaces to the processor 902 for storage of data and one or more applications 906 (e.g., a video player software, user feedback component software, etc.). Other applications can include voice recognition of predetermined voice commands that facilitate initiation of the user feedback signals. The applications 906 can be stored in the memory 904 and/or in a firmware 908, and executed by the processor 902 from either or both the memory 904 or/and the firmware 908. The firmware 908 can also store startup code for execution in initializing the handset 900. A communications component 910 interfaces to the processor 902 to facilitate wired/wireless communication with external systems, e.g., cellular networks, VoIP networks, and so on. Here, the communications component 910 can also include a suitable cellular transceiver 911 (e.g., a GSM transceiver) and/or an unlicensed transceiver 913 (e.g., Wi-Fi, WiMax) for corresponding signal communications. The handset 900 can be a device such as a cellular telephone, a PDA with mobile communications capabilities, and messaging-centric devices. The communications component 910 also facilitates communications reception from terrestrial radio networks (e.g., broadcast), digital satellite radio networks, and Internet-based radio services networks.

The handset 900 includes a display 912 for displaying text, images, video, telephony functions (e.g., a Caller ID function), setup functions, and for user input. For example, the display 912 can also be referred to as a "screen" that can accommodate the presentation of multimedia content (e.g., music metadata, messages, wallpaper, graphics, etc.). The display 912 can also display videos and can facilitate the generation, editing and sharing of video quotes. A serial I/O interface 914 is provided in communication with the processor 902 to facilitate wired and/or wireless serial communications (e.g., USB, and/or IEEE 1394) through a hardwire connection, and other serial input devices (e.g., a keyboard, keypad, and mouse). This supports updating and troubleshooting the handset 900, for example. Audio capabilities are provided with an audio I/O component 916, which can include a speaker for the output of audio signals related to, for example, indication that the user pressed the proper key or key combination to initiate the user feedback signal. The audio I/O component 916 also facilitates the input of audio signals through a microphone to record data and/or telephony voice data, and for inputting voice signals for telephone conversations.

The handset 900 can include a slot interface 918 for accommodating a SIC (Subscriber Identity Component) in the form factor of a card Subscriber Identity Module (SIM) or universal SIM 920, and interfacing the SIM card 920 with the processor 902. However, it is to be appreciated that the SIM card 920 can be manufactured into the handset 900, and updated by downloading data and software.

The handset 900 can process IP data traffic through the communication component 910 to accommodate IP traffic from an IP network such as, for example, the Internet, a corporate intranet, a home network, a person area network, etc., through an ISP or broadband cable provider. Thus, VoIP traffic can be utilized by the handset 800 and IP-based multimedia content can be received in either an encoded or decoded format.

A video processing component 922 (e.g., a camera) can be provided for decoding encoded multimedia content. The video processing component 922 can aid in facilitating the generation, editing and sharing of video quotes. The handset 900 also includes a power source 924 in the form of batteries and/or an AC power subsystem, which power source 924 can interface to an external power system or charging equipment (not shown) by a power I/O component 926.

The handset 900 can also include a video component 930 for processing video content received and, for recording and transmitting video content. For example, the video component 930 can facilitate the generation, editing and sharing of video quotes. A location tracking component 932 facilitates geographically locating the handset 900. As described hereinabove, this can occur when the user initiates the feedback signal automatically or manually. A user input component 934 facilitates the user initiating the quality feedback signal. The user input component 934 can also facilitate the generation, editing and sharing of video quotes. The user input component 934 can include such conventional input device technologies such as a keypad, keyboard, mouse, stylus pen, and/or touch screen, for example.

Referring again to the applications 906, a hysteresis component 936 facilitates the analysis and processing of hysteresis data, which is utilized to determine when to associate with the access point. A software trigger component 938 can be provided that facilitates triggering of the hysteresis component 938 when the Wi-Fi transceiver 913 detects the beacon of the access point. A SIP client 940 enables the handset 900 to support SIP protocols and register the subscriber with the SIP registrar server. The applications 906 can also include a client 942 that provides at least the capability of discovery, play and store of multimedia content, for example, music.

The handset 900 can include an indoor network radio transceiver 913 (e.g., Wi-Fi transceiver). This function supports the indoor radio link, such as IEEE 802.11, for the dual-mode GSM handset 900. The handset 900 can accommodate at least satellite radio services through a handset that can combine wireless voice and digital radio chipsets into a single handheld device.

Figure 10:
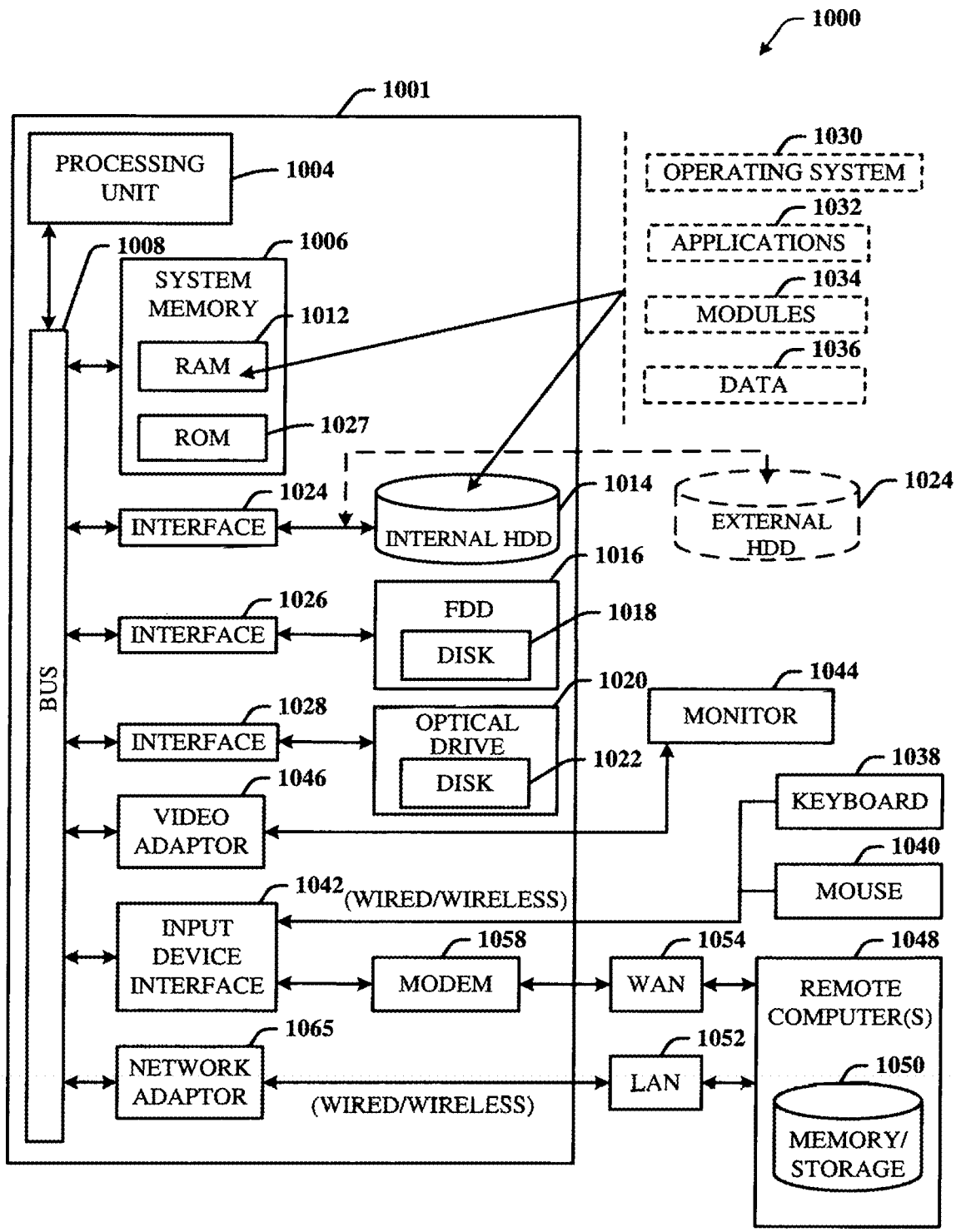
FIG. 10 illustrates an example block diagram of a computer that can be operable to execute processes and methods in accordance with various aspects and embodiments of the subject disclosure.

Referring now to FIG. 10, there is illustrated a block diagram of a computer 1000 operable to execute the functions and operations performed in the described example embodiments. For example, a network node (e.g., network node 306) may contain components as described in FIG. 10. The computer 1000 can provide networking and communication capabilities between a wired or wireless communication network and a server and/or communication device. In order to provide additional context for various aspects thereof, FIG. 10 and the following discussion are intended to provide a brief, general description of a suitable computing environment in which the various aspects of the innovation can be implemented to facilitate the establishment of a transaction between an entity and a third party. While the description above is in the general context of computer-executable instructions that can run on one or more computers, those skilled in the art will recognize that the innovation also can be implemented in combination with other program modules and/or as a combination of hardware and software.

Generally, program modules include routines, programs, components, data structures, etc., that perform particular tasks or implement particular abstract data types. Moreover, those skilled in the art will appreciate that the inventive methods can be practiced with other computer system configurations, including single-processor or multiprocessor computer systems, minicomputers, mainframe computers, as well as personal computers, hand-held computing devices, microprocessor-based or programmable consumer electronics, and the like, each of which can be operatively coupled to one or more associated devices.

The illustrated aspects of the innovation can also be practiced in distributed computing environments where certain tasks are performed by remote processing devices that are linked through a communications network. In a distributed computing environment, program modules can be located in both local and remote memory storage devices.

Computing devices typically include a variety of media, which can include computer-readable storage media or communications media, which two terms are used herein differently from one another as follows.

Computer-readable storage media can be any available storage media that can be accessed by the computer and includes both volatile and nonvolatile media, removable and non-removable media. By way of example, and not limitation, computer-readable storage media can be implemented in connection with any method or technology for storage of information such as computer-readable instructions, program modules, structured data, or unstructured data. Computer-readable storage media can include, but are not limited to, RAM, ROM, EEPROM, flash memory or other memory technology, CD-ROM, digital versatile disk (DVD) or other optical disk storage, magnetic cassettes, magnetic tape, magnetic disk storage or other magnetic storage devices, or other tangible and/or non-transitory media which can be used to store desired information. Computer-readable storage media can be accessed by one or more local or remote computing devices, e.g., via access requests, queries or other data retrieval protocols, for a variety of operations with respect to the information stored by the medium.

Communications media can embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, RF, infrared and other wireless media.

With reference to FIG. 10, implementing various aspects described herein with regards to the end-user device can include a computer 1000, the computer 1000 including a processing unit 1004, a system memory 1006 and a system bus 1008. The system bus 1008 couples system components including, but not limited to, the system memory 1006 to the processing unit 1004. The processing unit 1004 can be any of various commercially available processors. Dual microprocessors and other multiprocessor architectures can also be employed as the processing unit 1004.

The system bus 1008 can be any of several types of bus structure that can further interconnect to a memory bus (with or without a memory controller), a peripheral bus, and a local bus using any of a variety of commercially available bus architectures. The system memory 1006 includes read-only memory (ROM) 1027 and random access memory (RAM) 1012. A basic input/output system (BIOS) is stored in a non-volatile memory 1027 such as ROM, EPROM, EEPROM, which BIOS contains the basic routines that help to transfer information between elements within the computer 1000, such as during start-up. The RAM 1012 can also include a high-speed RAM such as static RAM for caching data.

The computer 1000 further includes an internal hard disk drive (HDD) 1014 (e.g., EIDE, SATA), which internal hard disk drive 1014 can also be configured for external use in a suitable chassis (not shown), a magnetic floppy disk drive (FDD) 1016, (e.g., to read from or write to a removable diskette 1018) and an optical disk drive 1020, (e.g., reading a CD-ROM disk 1022 or, to read from or write to other high capacity optical media such as the DVD). The hard disk drive 1014, magnetic disk drive 1016 and optical disk drive 1020 can be connected to the system bus 1008 by a hard disk drive interface 1024, a magnetic disk drive interface 1026 and an optical drive interface 1028, respectively. The interface 1024 for external drive implementations includes at least one or both of Universal Serial Bus (USB) and IEEE 1294 interface technologies. Other external drive connection technologies are within contemplation of the subject innovation.

The drives and their associated computer-readable media provide nonvolatile storage of data, data structures, computer-executable instructions, and so forth. For the computer 1000 the drives and media accommodate the storage of any data in a suitable digital format. Although the description of computer-readable media above refers to a HDD, a removable magnetic diskette, and a removable optical media such as a CD or DVD, it should be appreciated by those skilled in the art that other types of media which are readable by a computer 1000, such as zip drives, magnetic cassettes, flash memory cards, cartridges, and the like, can also be used in the example operating environment, and further, that any such media can contain computer-executable instructions for performing the methods of the disclosed innovation.

A number of program modules can be stored in the drives and RAM 1012, including an operating system 1030, one or more application programs 1032, other program modules 1034 and program data 1036. All or portions of the operating system, applications, modules, and/or data can also be cached in the RAM 1012. It is to be appreciated that the innovation can be implemented with various commercially available operating systems or combinations of operating systems.

A user can enter commands and information into the computer 1000 through one or more wired/wireless input devices, e.g., a keyboard 1038 and a pointing device, such as a mouse 1040. Other input devices (not shown) may include a microphone, an IR remote control, a joystick, a game pad, a stylus pen, touch screen, or the like. These and other input devices are often connected to the processing unit 1004 through an input device interface 1042 that is coupled to the system bus 1008, but can be connected by other interfaces, such as a parallel port, an IEEE 2394 serial port, a game port, a USB port, an IR interface, etc.

A monitor 1044 or other type of display device is also connected to the system bus 1008 through an interface, such as a video adapter 1046. In addition to the monitor 1044, a computer 1000 typically includes other peripheral output devices (not shown), such as speakers, printers, etc.

The computer 1000 can operate in a networked environment using logical connections by wired and/or wireless communications to one or more remote computers, such as a remote computer(s) 1048. The remote computer(s) 1048 can be a workstation, a server computer, a router, a personal computer, portable computer, microprocessor-based entertainment device, a peer device or other common network node, and typically includes many or all of the elements described relative to the computer, although, for purposes of brevity, only a memory/storage device 1050 is illustrated. The logical connections depicted include wired/wireless connectivity to a local area network (LAN) 1052 and/or larger networks, e.g., a wide area network (WAN) 1054. Such LAN and WAN networking environments are commonplace in offices and companies, and facilitate enterprise-wide computer networks, such as intranets, all of which may connect to a global communications network, e.g., the Internet.

When used in a LAN networking environment, the computer 1000 is connected to the local network 1052 through a wired and/or wireless communication network interface or adapter 1056. The adapter 1056 may facilitate wired or wireless communication to the LAN 1052, which may also include a wireless access point disposed thereon for communicating with the wireless adapter 1056.

When used in a WAN networking environment, the computer 1000 can include a modem 1058, or is connected to a communications server on the WAN 1054, or has other means for establishing communications over the WAN 1054, such as by way of the Internet. The modem 1058, which can be internal or external and a wired or wireless device, is connected to the system bus 1008 through the input device interface 1042. In a networked environment, program modules depicted relative to the computer, or portions thereof, can be stored in the remote memory/storage device 1050. It will be appreciated that the network connections shown are exemplary and other means of establishing a communications link between the computers can be used.

The computer is operable to communicate with any wireless devices or entities operatively disposed in wireless communication, e.g., a printer, scanner, desktop and/or portable computer, portable data assistant, communications satellite, any piece of equipment or location associated with a wirelessly detectable tag (e.g., a kiosk, news stand, restroom), and telephone. This includes at least Wi-Fi and Bluetooth™ wireless technologies. Thus, the communication can be a predefined structure as with a conventional network or simply an ad hoc communication between at least two devices.

Wi-Fi, or Wireless Fidelity, allows connection to the Internet from a couch at home, a bed in a hotel room, or a conference room at work, without wires. Wi-Fi is a wireless technology similar to that used in a cell phone that enables such devices, e.g., computers, to send and receive data indoors and out; anywhere within the range of a base station. Wi-Fi networks use radio technologies called IEEE 802.11 (a, b, g, n, etc.) to provide secure, reliable, fast wireless connectivity. A Wi-Fi network can be used to connect computers to each other, to the Internet, and to wired networks (which use IEEE 802.3 or Ethernet). Wi-Fi networks operate in the unlicensed 2.4 and 5 GHz radio bands, at an 11 Mbps (802.11b) or 54 Mbps (802.11a) data rate, for example, or with products that contain both bands (dual band), so the networks can provide real-world performance similar to the basic "10BaseT" wired Ethernet networks used in many offices.

As used in this application, the terms "system," "component," "interface," and the like are generally intended to refer to a computer-related entity or an entity related to an operational machine with one or more specific functionalities. The entities disclosed herein can be either hardware, a combination of hardware and software, software, or software in execution. For example, a component may be, but is not limited to being, a process running on a processor, a processor, an object, an executable, a thread of execution, a program, and/or a computer. By way of illustration, both an application running on a server and the server can be a component. One or more components may reside within a process and/or thread of execution and a component may be localized on one computer and/or distributed between two or more computers. These components also can execute from various computer readable storage media having various data structures stored thereon. The components may communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry that is operated by software or firmware application(s) executed by a processor, wherein the processor can be internal or external to the apparatus and executes at least a part of the software or firmware application. As yet another example, a component can be an apparatus that provides specific functionality through electronic components without mechanical parts, the electronic components can comprise a processor therein to execute software or firmware that confers at least in part the functionality of the electronic components. An interface can comprise input/output (I/O) components as well as associated processor, application, and/or API components.

Furthermore, the disclosed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, computer-readable carrier, or computer-readable media. For example, computer-readable media can include, but are not limited to, a magnetic storage device, e.g., hard disk; floppy disk;

magnetic strip(s); an optical disk (e.g., compact disk (CD), a digital video disc (DVD), a Blu-ray Disc™ (BD)); a smart card; a flash memory device (e.g., card, stick, key drive); and/or a virtual device that emulates a storage device and/or any of the above computer-readable media.

As it employed in the subject specification, the term "processor" can refer to substantially any computing processing unit or device comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Processors can exploit nano-scale architectures such as, but not limited to, molecular and quantum-dot based transistors, switches and gates, in order to optimize space usage or enhance performance of user equipment. A processor also can be implemented as a combination of computing processing units.

In the subject specification, terms such as "store," "data store," "data storage," "database," "repository," "queue", and substantially any other information storage component relevant to operation and functionality of a component, refer to "memory components," or entities embodied in a "memory" or components comprising the memory. It will be appreciated that the memory components described herein can be either volatile memory or nonvolatile memory, or can comprise both volatile and nonvolatile memory. In addition, memory components or memory elements can be removable or stationary. Moreover, memory can be internal or external to a device or component, or removable or stationary. Memory can comprise various types of media that are readable by a computer, such as hard-disc drives, zip drives, magnetic cassettes, flash memory cards or other types of memory cards, cartridges, or the like.

By way of illustration, and not limitation, nonvolatile memory can comprise read only memory (ROM), programmable ROM (PROM), electrically programmable ROM (EPROM), electrically erasable ROM (EEPROM), or flash memory. Volatile memory can comprise random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). Additionally, the disclosed memory components of systems or methods herein are intended to comprise, without being limited to comprising, these and any other suitable types of memory.

In particular and in regard to the various functions performed by the above described components, devices, circuits, systems and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated example aspects of the embodiments. In this regard, it will also be recognized that the embodiments comprise a system as well as a computer-readable medium having computer-executable instructions for performing the acts and/or events of the various methods.

Computing devices typically comprise a variety of media, which can comprise computer-readable storage media and/or communications media, which two terms are used herein differently from one another as follows. Computer-readable storage media can be any available storage media that can be accessed by the computer and comprises both volatile and nonvolatile media, removable and non-removable media. By way of example, and not limitation, computer-readable storage media can be implemented in connection with any method or technology for storage of information such as computer-readable instructions, program modules, structured data, or unstructured data. Computer-readable storage media can comprise, but are not limited to, RAM, ROM, EEPROM, flash memory or other memory technology, CD-ROM, digital versatile disk (DVD) or other optical disk storage, magnetic cassettes, magnetic tape, magnetic disk storage or other magnetic storage devices, or other tangible and/or non-transitory media which can be used to store desired information. Computer-readable storage media can be accessed by one or more local or remote computing devices, e.g., via access requests, queries or other data retrieval protocols, for a variety of operations with respect to the information stored by the medium.

On the other hand, communications media typically embody computer-readable instructions, data structures, program modules or other structured or unstructured data in a data signal such as a modulated data signal, e.g., a carrier wave or other transport mechanism, and comprises any information delivery or transport media. The term "modulated data signal" or signals refers to a signal that has one or more of its characteristics set or changed in such a manner as to encode information in one or more signals. By way of example, and not limitation, communications media comprise wired media, such as a wired network or direct-wired connection, and wireless media such as acoustic, RF, infrared and other wireless media.

Further, terms like "user equipment," "user device," "mobile device," "mobile," station," "access terminal," "terminal," "handset," and similar terminology, generally refer to a wireless device utilized by a subscriber or user of a wireless communication network or service to receive or convey data, control, voice, video, sound, gaming, or substantially any data-stream or signaling-stream. The foregoing terms are utilized interchangeably in the subject specification and related drawings. Likewise, the terms "access point," "node B," "base station," "evolved Node B," "cell," "cell site," and the like, can be utilized interchangeably in the subject application, and refer to a wireless network component or appliance that serves and receives data, control, voice, video, sound, gaming, or substantially any data-stream or signaling-stream from a set of subscriber stations. Data and signaling streams can be packetized or frame-based flows. It is noted that in the subject specification and drawings, context or explicit distinction provides differentiation with respect to access points or base stations that serve and receive data from a mobile device in an outdoor environment, and access points or base stations that operate in a confined, primarily indoor environment overlaid in an outdoor coverage area. Data and signaling streams can be packetized or frame-based flows.

Furthermore, the terms "user," "subscriber," "customer," "consumer," and the like are employed interchangeably throughout the subject specification, unless context warrants particular distinction(s) among the terms. It should be appreciated that such terms can refer to human entities, associated devices, or automated components supported through artificial intelligence (e.g., a capacity to make inference based on complex mathematical formalisms) which can provide simulated vision, sound recognition and so forth. In addition, the terms "wireless network" and "network" are used interchangeable in the subject application, when context wherein the term is utilized warrants distinction for clarity purposes such distinction is made explicit.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

In addition, while a particular feature may have been disclosed with respect to only one of several implementations, such feature may be combined with one or more other features of the other implementations as may be desired and advantageous for any given or particular application. Furthermore, to the extent that the terms "includes" and "including" and variants thereof are used in either the detailed description or the claims, these terms are intended to be inclusive in a manner similar to the term "comprising."

The above descriptions of various embodiments of the subject disclosure and corresponding figures and what is described in the Abstract, are described herein for illustrative purposes, and are not intended to be exhaustive or to limit the disclosed embodiments to the precise forms disclosed. It is to be understood that one of ordinary skill in the art may recognize that other embodiments having modifications, permutations, combinations, and additions can be implemented for performing the same, similar, alternative, or substitute functions of the disclosed subject matter, and are therefore considered within the scope of this disclosure. Therefore, the disclosed subject matter should not be limited to any single embodiment described herein, but rather should be construed in breadth and scope in accordance with the claims below.

What is claimed is:

1. A transmitter device, comprising:
a processor; and
a non-transitory memory that stores executable instructions that, when executed by the processor, facilitate performance of operations, comprising:
transmitting a scrambling identification number to a receiving device via radio resource control channel signaling, wherein the scrambling identification number is based on a function of a cell identification number and a pseudo-random number generator, and wherein the data channel information block is associated with at least one of an ultra-reliable low latency type communication or a massive machine type of communication;
based on a type of a polar forward error correction code, determining locations of frozen bits in a data channel information block;
coding non-frozen bits of the data channel information block with data channel data to facilitate a data transmission; and
coding the frozen bits of the data channel information block with the scrambling identification number, resulting in bits coded with the scrambling identification number.

2. The transmitter device of claim 1, wherein the frozen bits are determined to have a decoding reliability below a predetermined reliability threshold.

3. The transmitter device of claim 1, wherein the operations further comprise:
encoding the data channel information block with the polar forward error correction code into a codeword equal in length to a sum of the frozen bits and the non-frozen bits.

4. The transmitter device of claim 1, wherein the coding the frozen bits comprises:
coding the frozen bits with cyclic redundancy check bits; and
masking the cyclic redundancy check bits with the scrambling identification number.

5. The transmitter device of claim 1, wherein a first number of the frozen bits is larger than a second number of bits of the scrambling identification number, and wherein the bits coded with the scrambling identification number are determined to be a most reliable group of bits of the frozen bits according to a defined reliability criterion.

6. The transmitter device of claim 1, wherein the scrambling identification number comprises a radio network temporary identifier number.

7. The transmitter device of claim 1, wherein the operations further comprise:
determining a location of the frozen bits in the data channel information block based on respective estimated signal to noise ratios of the locations.

8. The transmitter device of claim 1, wherein the operations further comprise:
determining a location of the frozen bits in the data channel information block based on respective fixed weight computations of the locations.

9. The transmitter device of claim 1, wherein the pseudo-random number generator uses a length-31 Gold sequence.

10. The transmitter device of claim 1, wherein the operations further comprise:
ranking reliability of bits in the data channel information block in an order from highest reliability to lowest reliability.

11. A method, comprising:
transmitting, by a device comprising a processor, a scrambling identification number to a receiver via radio resource control channel signaling, wherein the scrambling identification number is based on a function of a cell identification number and a pseudo-random number generator, and wherein the data channel information block is associated with at least one of an ultra-reliable low latency type communication or a massive machine type of communication;
determining, by the device, respective reliabilities respectively corresponding to bit locations in a data channel information block, the determining the respective reliabilities being based on a type of a polar forward error correction code;

coding, with data traffic data and by the device, a first group of the bit locations determined to have first reliabilities of the respective reliabilities above a first reliability threshold; and coding, with the scrambling identification number and by the device, a second group of bit locations determined to have second reliabilities of the respective reliabilities below a second reliability value.

12. The method of claim 11, wherein the second group of bit locations comprises most reliable bit locations of the data channel information block and excludes the first group of bit locations.

13. The method of claim 11, further comprising:
coding, by the device, bit locations other than the first group of bit locations and the second group of bit locations with null bits.

14. The method of claim 11 further comprising:
encoding, by the device, the data channel information block with the polar forward error correction code into a codeword.

15. The method of claim 14, further comprising:
splitting the codeword into partial codewords to facilitate rate matching of a transmission block.

16. The method of claim 11, further comprising:
coding bits of the second group of bit locations with cyclic redundancy check bits; and
masking the cyclic redundancy check bits with the scrambling identification number.

17. The method of claim 11, wherein the scrambling identification number comprises a radio network temporary identifier number.

18. The method of claim 11, wherein the scrambling identification number comprises 16 bits.

19. A non-transitory machine-readable medium, comprising executable instructions that, when executed by a processor of a device, facilitate performance of operations, comprising:
receiving a scrambling identification number from a transmitter device via radio resource control channel signaling, wherein the scrambling identification number is based on a function of a cell identification number and a pseudo-random number generator, and wherein the data channel information block is associated with at least one of an ultra-reliable low latency type communication or a massive machine type of communication;
decoding a data channel information block with a polar forward error correction code resulting in a decoded data channel information block;
based on a type of the polar forward error correction code, determining locations of a group of frozen bits in the decoded data channel information block; and
unmasking the group of frozen bits with the scrambling identification number, wherein the unmasking results in cyclic redundancy check bits.

20. The non-transitory machine-readable medium of claim 19, wherein the operations further comprise:
in response to the cyclic redundancy check bits passing a cyclic redundancy check based on the polar forward error correction code, transmitting an acknowledgement to the transmitter device.

* * * * *